US012639275B2

(12) United States Patent
Raman et al.

(10) Patent No.: US 12,639,275 B2
(45) Date of Patent: May 26, 2026

(54) FILTERS FOR QUALITY CONTROL OF SYNTHETICALLY GENERATED DATA

(71) Applicant: NVIDIA Corporation, Santa Clara, CA (US)

(72) Inventors: Vinay Raman, San Jose, CA (US); Yoshi Suhara, Los Altos, CA (US); Oluwatobi Olabiyi, Falls Church, VA (US)

(73) Assignee: NVIDIA Corporation, Santa Clara, CA (US)

( * ) Notice: Subject to any disclaimer, the term of this patent is extended or adjusted under 35 U.S.C. 154(b) by 2 days.

(21) Appl. No.: 18/779,989

(22) Filed: Jul. 22, 2024

(65) Prior Publication Data

US 2026/0023727 A1 Jan. 22, 2026

(51) Int. Cl.
| | |
|---|---|
| *G06F 16/20* | (2019.01) |
| *G06F 16/215* | (2019.01) |
| *G06F 16/2458* | (2019.01) |
| *G06F 16/334* | (2025.01) |
| *G06F 16/903* | (2019.01) |
| G06F 18/21 | (2023.01) |
| G06F 30/27 | (2020.01) |

(52) U.S. Cl.
CPC ........ *G06F 16/215* (2019.01); *G06F 16/2458* (2019.01); *G06F 16/3347* (2019.01); *G06F 16/90344* (2019.01); *G06F 18/217* (2023.01); *G06F 30/27* (2020.01)

(58) Field of Classification Search
CPC .............. G06F 16/215; G06F 16/2458; G06F 16/3347; G06F 16/90344; G06F 18/217; G06F 30/27
See application file for complete search history.

(56) References Cited

U.S. PATENT DOCUMENTS

| | | | |
|---|---|---|---|
| 12,242,468 B1 * | 3/2025 | Brenner | G06F 16/242 |
| 12,353,469 B1 * | 7/2025 | Mahabadi | G06F 16/332 |
| 2021/0158176 A1 * | 5/2021 | Wan | G06F 16/9024 |
| 2025/0190459 A1 * | 6/2025 | Conway | G06N 3/0475 |
| 2025/0238474 A1 * | 7/2025 | Saini | G06F 16/9532 |

OTHER PUBLICATIONS

Liu, Jerry, "Fine-Tuning Embeddings for RAG with Synthetic Data," Medium, Aug. 25, 2023, 13 pages, downloaded Jul. 18, 2024, https://medium.com/llamaindex-blog/fine-tuning-embeddings-for-rag-with-synthetic-data-e534409a3971.
Ragas, "Synthetic Test Data generation," 2023, 5 pages, downloaded Jul. 18, 2024, https://docs.ragas.io/en/stable/concepts/testset_generation.html.

* cited by examiner

*Primary Examiner* — Diedra McQuitery

(74) *Attorney, Agent, or Firm* — Foley & Lardner LLP

(57) ABSTRACT

In various examples, a system can include one or more processors to determine, using a plurality of retriever models, a quality score of each of a plurality of queries in a first dataset, determine, using a plurality of embedding models, a metric indicative of a relationship between each of the plurality of queries and the set of text information of the first dataset, and select one of the plurality of embedding models as a filter model based at least in part on correlation between the metrics outputted by the plurality of embedding models and the quality scores for the plurality of queries, the filter model applied to filter a plurality of queries and a plurality of sets of text information in a second dataset.

20 Claims, 11 Drawing Sheets

| RETRIEVER MODELS | MANUAL ANNOTATED DATASET ( κ=5 ) |
|---|---|
| A | 0.72263 |
| B | 0.70803 |
| C | 0.62774 |

| QUALITY SCORE | % QUESTIONS |
|---|---|
| 3 | 58.39% |
| 2 | 10.95% |
| 1 | 8.76% |
| 0 | 21.90% |
| TOTAL QUESTIONS | 137 |

300

| Embedding Model | Correlation Cosine Similarity (Query, Document) w/Quality Scores |
|---|---|
| A | 0.767038 |
| B | 0.798973 |
| C | 0.661646 |
| D | 0.722315 |
| E | 0.796312 |

| Quality Score | Mean Cosine Similarity |
|---|---|
| 0 | 0.547 |
| 1 | 0.611 |
| 2 | 0.625 |
| 3 | 0.673 |

500

| A | B | C | D | E | F | G | H |
|---|---|---|---|---|---|---|---|
| Embedding Model | Manually Annotated | Syn. Unfiltered | Diff. (%) | Syn. Filtered(v1) | Diff. (%) | Syn. Filtered(v2) | Diff. (%) |
| A | 0.72263 | 0.79718 | 10.31648285 | 0.73834 | 2.174003294 | 0.7022 | -2.827172955 |
| B | 0.70803 | 0.81303 | 14.82988009 | 0.75844 | 7.119754813 | 0.7242 | 2.283801534 |
| C | 0.62774 | 0.75903 | 20.91470991 | 0.69094 | 10.06786249 | 0.6511 | 3.721285883 |
| D | 0.70073 | 0.8007 | 14.2665506 | 0.74327 | 6.070811868 | 0.7078 | 1.008947812 |
| E | 0.74453 | 0.81186 | 9.043289055 | 0.75602 | 1.664137107 | 0.7225 | -2.958913677 |
| | | | | | | | |
| Correl | | 0.9141853906 | | 0.9123726309 | | 0.9112413867 | |
| | | | | | | | |
| Quality Score | | | | | | | |
| 3 | 58.39% | 79.93% | | 1693 | 64.20174441 | 1375 | 59.52380952 |
| 2 | 10.95% | 10.53% | | 264 | 10.01137656 | 257 | 11.12554113 |
| 1 | 8.78% | 3.13% | | 162 | 6.14334471 | 160 | 6.928408028 |
| 0 | 21.90% | 6.40% | | 518 | 19.64353432 | 518 | 22.42424242 |
| Total Questions | 137 | 1500 | | 2637 | 100 | 2310 | |

Note: For easiness calcuations we have used only 3 embedding models

600

700

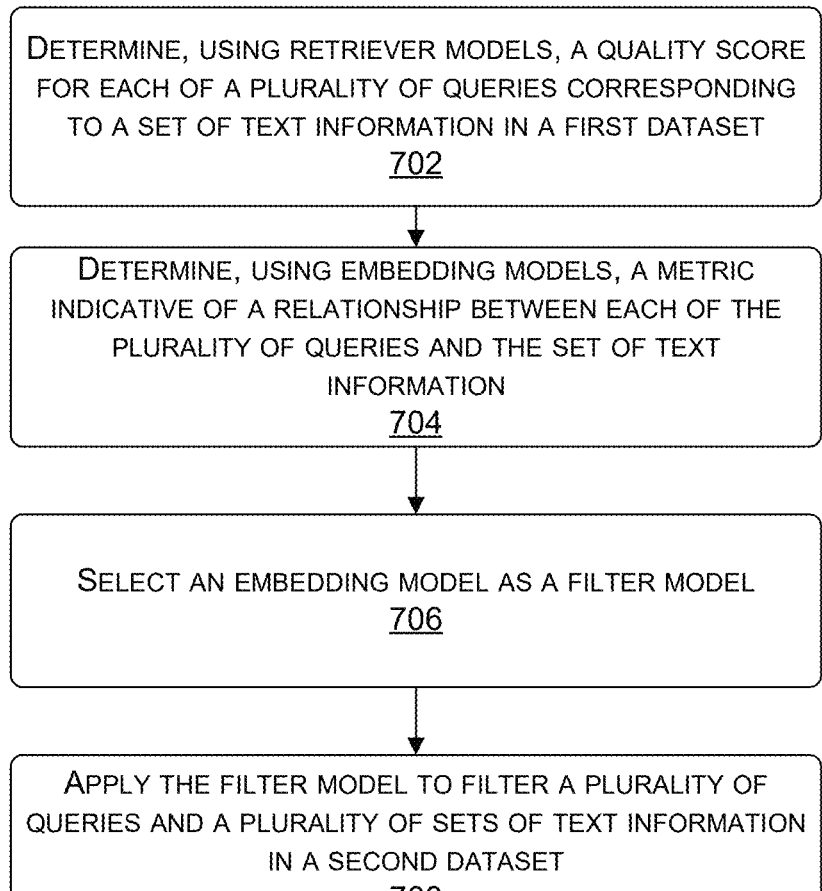

DETERMINE, USING RETRIEVER MODELS, A QUALITY SCORE FOR EACH OF A PLURALITY OF QUERIES CORRESPONDING TO A SET OF TEXT INFORMATION IN A FIRST DATASET
702

DETERMINE, USING EMBEDDING MODELS, A METRIC INDICATIVE OF A RELATIONSHIP BETWEEN EACH OF THE PLURALITY OF QUERIES AND THE SET OF TEXT INFORMATION
704

SELECT AN EMBEDDING MODEL AS A FILTER MODEL
706

APPLY THE FILTER MODEL TO FILTER A PLURALITY OF QUERIES AND A PLURALITY OF SETS OF TEXT INFORMATION IN A SECOND DATASET
708

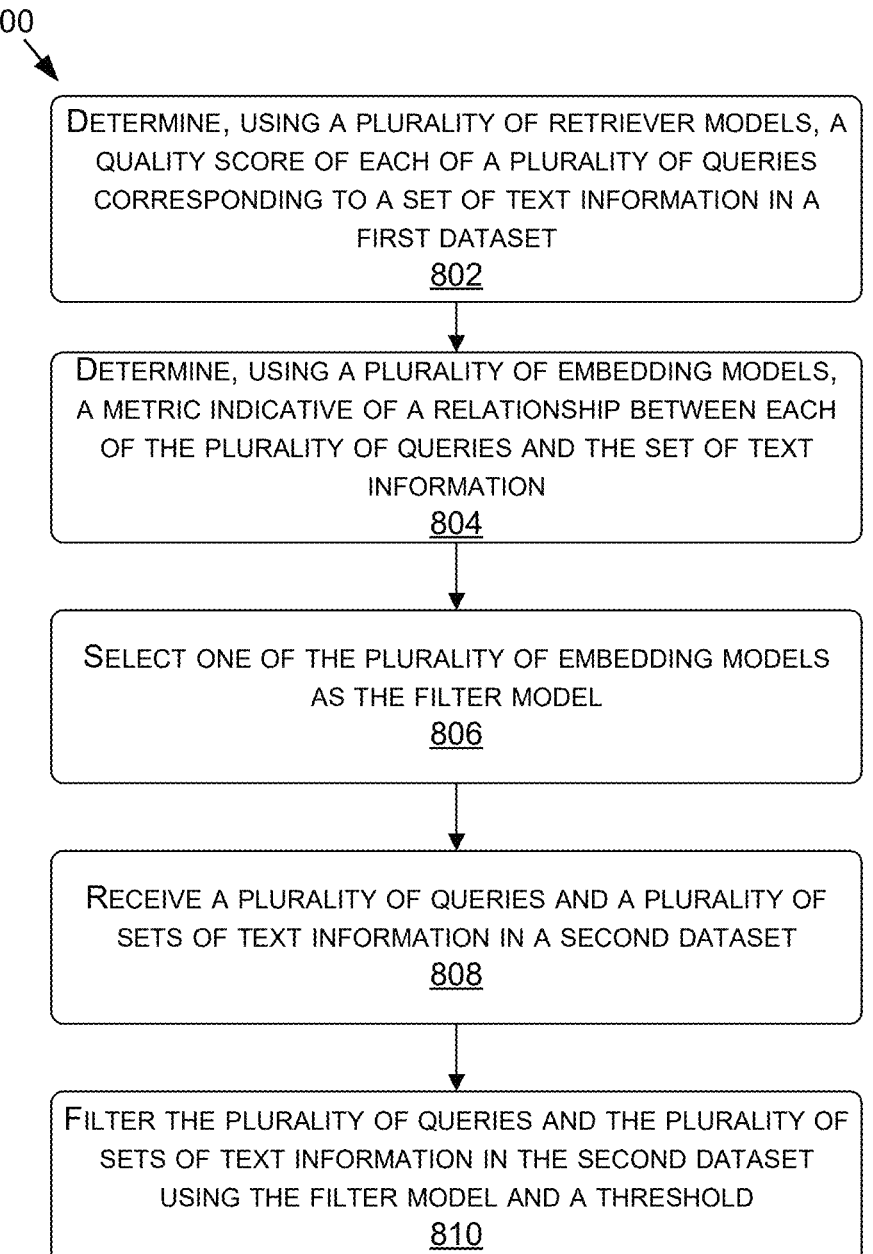

DETERMINE, USING A PLURALITY OF RETRIEVER MODELS, A QUALITY SCORE OF EACH OF A PLURALITY OF QUERIES CORRESPONDING TO A SET OF TEXT INFORMATION IN A FIRST DATASET
802

DETERMINE, USING A PLURALITY OF EMBEDDING MODELS, A METRIC INDICATIVE OF A RELATIONSHIP BETWEEN EACH OF THE PLURALITY OF QUERIES AND THE SET OF TEXT INFORMATION
804

SELECT ONE OF THE PLURALITY OF EMBEDDING MODELS AS THE FILTER MODEL
806

RECEIVE A PLURALITY OF QUERIES AND A PLURALITY OF SETS OF TEXT INFORMATION IN A SECOND DATASET
808

FILTER THE PLURALITY OF QUERIES AND THE PLURALITY OF SETS OF TEXT INFORMATION IN THE SECOND DATASET USING THE FILTER MODEL AND A THRESHOLD
810

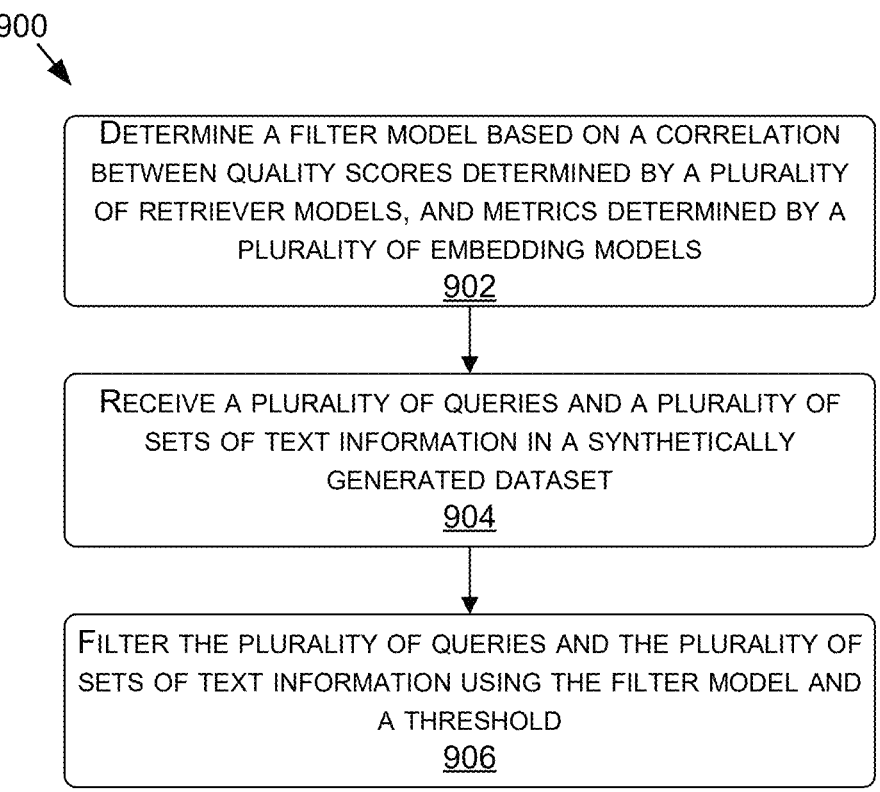

DETERMINE A FILTER MODEL BASED ON A CORRELATION BETWEEN QUALITY SCORES DETERMINED BY A PLURALITY OF RETRIEVER MODELS, AND METRICS DETERMINED BY A PLURALITY OF EMBEDDING MODELS
902

RECEIVE A PLURALITY OF QUERIES AND A PLURALITY OF SETS OF TEXT INFORMATION IN A SYNTHETICALLY GENERATED DATASET
904

FILTER THE PLURALITY OF QUERIES AND THE PLURALITY OF SETS OF TEXT INFORMATION USING THE FILTER MODEL AND A THRESHOLD
906

MEMORY
1004

I/O COMPONENTS
1014

CPU(S)
1006

POWER SUPPLY
1016

GPU(S)
1008

PRESENTATION
COMPONENT(S)
1018

COMM. INTERFACE
1010

LOGIC UNIT(S)
1020

I/O PORT(S)
1012

1002

1100

FILTERS FOR QUALITY CONTROL OF SYNTHETICALLY GENERATED DATA

BACKGROUND

Synthetically generated data can be used to evaluate, train, update, and customize retriever models and Retrieval Augmented Generation (RAG) pipelines. Conventional techniques to generate synthetic data lack methods to filter synthetic data, quantify quality of synthetic data, and generate data that is quantifiably similar in quality to the manually annotated datasets.

SUMMARY

Implementations of the present disclosure relate to filters for quality control of synthetically generated data. Systems and methods are disclosed that allow for configurable distribution of difficulty across synthetically generated data for retriever model evaluation and customization. The system can evaluate a plurality of embedding models to determine which embedding model of the plurality of embedding models to use as a filter for the synthetically generated data. The filter can be adjusted based on a desired difficulty for the synthetically generated data. The difficulty can refer to a number of the embedding models that can retrieve a set of text information in response to receiving a corresponding query. Systems and methods of the present disclosure can be used to train, evaluate, customize, and/or update retriever models, RAG pipelines, semantic searches, and/or other systems via synthetically generated data.

In contrast to conventional systems, such as those described above the system of the present disclosure can include one or more processors to determine, using a plurality of retriever models, a quality score of each of a plurality of queries in a first dataset, wherein the quality score is determined based at least part on a number of the plurality of retriever models having retrieved a set of text information corresponding to each of the plurality of queries, determine, using a plurality of embedding models, a metric indicative of a relationship between each of the plurality of queries and the set of text information of the first dataset, and select one of the plurality of embedding models as a filter model based at least in part on correlation between the metrics outputted by the plurality of embedding models and the quality scores for the plurality of queries, the filter model applied to filter a plurality of queries and a plurality of sets of text information in a second dataset.

In various implementations, the first dataset includes the plurality of queries and a plurality of sets of text information, each of the plurality of queries is annotated to be mapped to the set of text information. The set of text information can include, for each of the plurality of queries, at least one of at least one passage, at least one word, at least one phrase, at least one segment of texts, at least one string, at least one document, or at least one text file. Determining the quality score of each of the plurality of queries can include applying each of the plurality of queries as an input into each of the plurality of retriever models and determining at least one set of output text information from each of the retriever models based at least in part on the input, and determining the number of the plurality of retriever models each of which has the at least one set of output text information that comprises the set of text information.

In various implementations, determining the quality score of each of the plurality of queries can include applying each of the plurality of queries as an input into each of the plurality of retriever models and determining a plurality of sets of output text information from each of the retriever models based at least in part on the input, and determining the number of the plurality of retriever models each of which has the set of text information in a top k number of sets of the plurality of sets of output text information. The metric can include at least one of a cosine similarity between embeddings of each of the plurality of queries and embeddings of the set of text information, a Euclidian distance between embeddings of each of the plurality of queries and embeddings of the set of text information, or a dot product between embeddings of each of the plurality of queries and embeddings of the set of text information. The one of the plurality of embedding models having the metrics with highest correlation to the quality scores can be selected as the filter model.

In various implementations, the one or more processors are further to set the metric determined for each of the plurality of queries and the set of text information as a threshold in filtering the plurality of queries and the plurality of sets of text information in the second dataset. Setting the threshold can include determining an average value of the metrics determined by the filter model for each of the plurality of quality scores determined for the plurality of queries and determining the threshold based at least in part on the average value and a correlation value determined for the filter model for the correlation between the metrics outputted by the filter model and the quality scores for the plurality of queries. The threshold can be set to be an i-th percentile of the metrics outputted by the filter model. The filter model can filter the plurality of queries and the plurality of sets of text information in the second dataset to adjust difficulty of the plurality of queries and the plurality of sets of text information based on a threshold. The second dataset can include data synthetically generated using a language model, and the filtering can be configured to identify a subset of the second dataset.

In various implementations, the one or more processors are included in at least one of a control system for an autonomous or semi-autonomous machine, a perception system for an autonomous or semi-autonomous machine, a system implemented using a robot, an aerial system, a medical system, a boating system, a smart area monitoring system, a system for performing deep learning operations, a system for performing simulation operations, a system for generating or presenting virtual reality (VR) content, augmented reality (AR) content, or mixed reality (MR) content, a system for performing digital twin operations, a system implemented using an edge device, a system incorporating one or more virtual machines (VMs), a system for generating synthetic data, a system implemented at least partially in a data center, a system for performing conversational artificial intelligence (AI) operations, a system for performing generative AI operations, a system implementing language models, a system implementing chatbots, a system implementing semantic searches, a system implementing information retrieval, a system implementing vision language models (VLMs), a system implementing large language models (LLMs), a system implementing multi-modal language models, a system for hosting one or more real-time streaming applications, a system for performing light transport simulation, a system for performing collaborative content creation for 3D assets, or a system implemented at least partially using cloud computing resources.

At least one aspect of the present disclosure is directed to a system for applying a filter model determined using a first dataset, the system including one or more processors to receive a plurality of queries and a plurality of sets of text information in a second dataset. The one or more processors can filter, using the filter model and a threshold, the plurality of queries and the plurality of sets of text information in the second dataset, wherein the filter model is determined by determining, using a plurality of retriever models, a quality score of each of a plurality of queries in the first dataset, wherein the quality score is determined based at least part on a number of the plurality of retriever models having retrieved a set of text information corresponding to each of the plurality of queries, determining, using a plurality of embedding models, a metric indicative of a relationship between each of the plurality of queries and the set of text information, and selecting one of the plurality of embedding models as the filter model based at least in part on correlation between the metrics outputted by the plurality of embedding models and the quality scores for the plurality of queries.

In various implementations, the second dataset includes data synthetically generated using a language model, and the filtering can be configured to identify a subset of the second dataset. The metric can be determined for each of the plurality of queries and the set of text information is set as the threshold in filtering the plurality of queries and the plurality of sets of text information in the second dataset. Setting the threshold can include determining an average value of the metrics determined by the filter model for each of the plurality of quality scores determined for the plurality of queries and determining the threshold based at least in part on the average value and a correlation value determined for the filter model for the correlation between the metrics outputted by the filter model and the quality scores for the plurality of queries. The threshold can be set to be an i-th percentile of the metrics outputted by the filter model. The plurality of queries and the plurality of sets of text information in the second dataset can be filtered to adjust difficulty of the plurality of queries and the plurality of sets of text information based on a threshold.

At least one aspect is directed to a method. The method can include to receive a plurality of queries and a plurality of sets of text information in a synthetically generated dataset and filter, using a filter model and a threshold, the plurality of queries and the plurality of sets of text information in the synthetically generated dataset. The filter model can be determined based at least part on correlation between quality scores for a plurality of queries in a first dataset determined using a plurality of retriever models and metrics, determined using a plurality of embedding models, that are indicative of relationships between the plurality of queries and the plurality of sets of text information of the first dataset, wherein the filter model is selected from the plurality of embedding models.

BRIEF DESCRIPTION OF THE DRAWINGS

The present systems and methods for filters for quality control of synthetically generated data are described in detail below with reference to the attached drawing figures, wherein:

FIG. 7 is a flow diagram of an example method for selecting and applying a filter model, in accordance with some implementations of the present disclosure;

FIG. 8 is a flow diagram of an example method of selecting a filter model, and filtering using the filter model and a threshold, in accordance with some implementations of the present disclosure;

FIG. 9 is a flow diagram of another example method of selecting a filter model, and filtering using the filter model and a threshold, in accordance with some implementations of the present disclosure;

DETAILED DESCRIPTION

Figure 1:
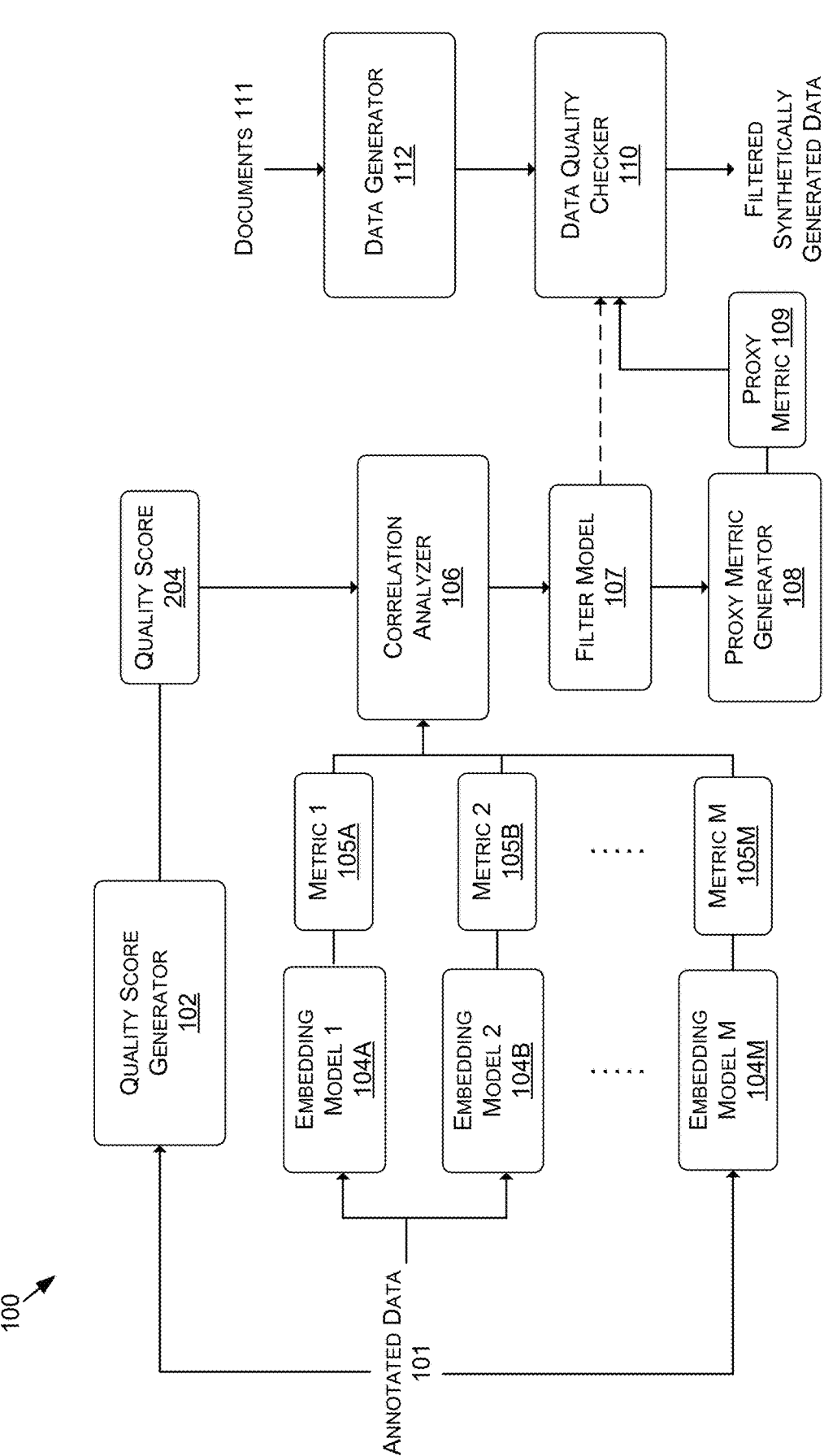
FIG. 1 is a block diagram of an example of a system to determining filters for quality control of synthetically generated data, in accordance with some implementations of the present disclosure.

Systems and methods are disclosed related to filters for quality control of synthetically generated data generated via or for large language models (LLMs), vision language models (VLMs), multi-modal language models, and/or other model types, such as for use in training or updating (e.g., parameters—weights and biases—of) retriever models via synthetically generated data. As non-limiting examples, the synthetically generated data can include a collection of queries (e.g., questions) and sets of text information (e.g., documents). Each question can correspond to one or more sets of text information, and vice versa. This can be useful in training retriever models to retrieve relevant sets of text information in response to a question. Manually annotated datasets often include a variety of difficult questions to properly train retriever models.

Although primarily described as text queries with text information, this is not intended to be limiting, and the systems, methods, processes, etc. described herein can be applied to other types of data retrieval/evaluation, such as image, video, audio, computer aided design (CAD), 2D/3D design documents/assets/models/etc., 3D content collaboration platform data (e.g., NVIDIA's OMNIVERSE, such as in universal scene descriptor (USD) or Open-USD format), etc., without departing from the scope of the present disclosure.

Systems and methods in accordance with the present disclosure can constrain a distribution of the synthetically generated data to mimic a difficulty distribution of manually annotated data, such as filtering the synthetically generated data by question difficulty. For example, the system can calculate a metric of one or more embedding models based on a similarity between embeddings of the question and the set of text information, and compare the metric to a calculated quality score based on one or more retriever models successfully retrieving the set of text information in response to the question. The system can then select the embedding model that correlates the most with the calculated quality score, and use the embedding model to filter the synthetically generated data to enhance a quality of the synthetically generated data to mimic that of manually annotated data.

The systems and methods described herein may be used for a variety of purposes, by way of example and without limitation, for machine control, machine locomotion, machine driving, synthetic data generation, model training, perception, augmented reality, virtual reality, mixed reality, robotics, security and surveillance, simulation and digital twinning, autonomous or semi-autonomous machine applications, deep learning, environment simulation, object or actor simulation and/or digital twinning, data center processing, conversational AI, light transport simulation (e.g., ray-tracing, path tracing, etc.), collaborative content creation for 3D assets (e.g., OMNIVERSE, using USD, open-USD, etc.), cloud computing, and/or any other suitable applications.

Disclosed implementations may be comprised in a variety of different systems such as automotive systems (e.g., a control system for an autonomous or semi-autonomous machine, a perception system for an autonomous or semi-autonomous machine), systems implemented using a robot, aerial systems, medial systems, boating systems, smart area monitoring systems, systems for performing deep learning operations, systems for performing simulation operations, systems for performing digital twin operations, systems implemented using an edge device, systems incorporating one or more virtual machines (VMs), systems for performing synthetic data generation operations, systems implemented at least partially in a data center, systems for performing conversational AI operations, systems implementing one or more large language models (LLMs), systems implementing one or more vision language models (VLMs), systems implementing one or more multi-modal language models, systems for performing light transport simulation, systems for performing collaborative content creation for 3D assets, (e.g., via open-USD data formats) systems implemented at least partially using cloud computing resources, and/or other types of systems.

With reference to FIG. 1, FIG. 1 is an example system 100 to determining filters for quality control of synthetically generated data, in accordance with some implementations of the present disclosure. It should be understood that this and other arrangements described herein are set forth only as examples. Other arrangements and elements (e.g., machines, interfaces, functions, orders, groupings of functions, etc.) may be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by entities may be carried out by hardware, firmware, and/or software. For instance, various functions may be carried out by a processor executing instructions stored in memory.

The system 100 can include one or more quality score generators 102 that generates a quality score 204. The quality score generators 102 can receive annotated data 101, such as manually annotated data in a manually annotated data set. In other examples, the annotated data 101 can include data annotated automatically or semiautomatically by one or more machine learning algorithms. The annotated data 101 can include sets of text information and queries. The sets of text information can include, but not limited to, at least one passage, word, phrase, segment of text, string, document, text file, etc. The queries can include, but not limited to, text strings, questions, phrases, statements, etc. The annotated data 101 can include a corpus (e.g., database) of sets of text information, and each query can correspond to (e.g., annotated with) at least one of the sets of text information of the corpus of sets of text information. For example, each of the queries of the annotated data 101 can be annotated to map (e.g., correspond) to one of the sets of text information. In other words, each query is intended to be answered with a corresponding set of text information, e.g., the response to the query is a set of text information.

The quality score generator 102 can include one or more retriever models to determine a quality score based on the annotated data 101. Retriever models can be configured to receive an input (e.g., query) and parse through a database of text information to provide an output (e.g., set of text information) in response to the input. Examples of retriever models include neural network-based, Boolean, vector space, and probabilistic models. For example, a neural network-based retriever model can use deep learning to evaluate embeddings of the query and sets of text information. The retriever model can then calculate a similarity (e.g., cosine similarity) between the embeddings to determine if the set of text information is relevant to the query. The retriever models can output one or more relevant sets of text information in response to the query.

The quality score can be a number of retriever models that retrieve the set of text information that corresponds to the query. For example, the quality score generator 102 can receive queries from the annotated data 101, feed the queries to the retriever models, and determine a quality score based on a number of retriever models that returned the set of text information corresponding to each query. The quality score can be an easiness score in that a higher quality score indicates that a higher number of retriever models can retrieve the corresponding set of text information responsive to the query (e.g., the question is easy for retriever models to retrieve the corresponding set of text information).

The system 100 can include a first embedding model 104A, a second embedding model 104B, and m embedding models 104M (herein referred to as embedding models 104). M embedding models 104M can encompass any number of embedding models. The embedding models 104 can embed (e.g., transform) the annotated data 101 into embeddings (e.g., vectors in a latent or embedding space) that represent the sets of text (and/or image, video, audio, 3D data, etc.) information and the queries (e.g., textual, audible, image-based, etc.) of the annotated data 101. Each of the embedding models 104 can be a different embedding model. For example, one of the embedding models 104 can be word embedding model (e.g., embeds words of the set of text information) while another of the embedding models 104 is a contextual embedding model (e.g., embeds words based on surrounding words of the set of text information). Examples of embedding models 104 include neural network-based, Boolean, vector space, and probabilistic models. For example, a neural network-based embedding model can utilize deep learning to evaluate embeddings of the query and sets of text information.

Each of the embedding models 104 can calculate and output a metric 105 (e.g., a first metric 105A, a second metric 105B, and a m metric 105M) based on the annotated data 101 as seen in FIG. 1. The metric 105 can represent a similarity (e.g., relevance) between embeddings generated by the embedding models 104 for the sets of text information and the query. The metric 105 can be calculated by, but not limited to, a cosine similarity, a Euclidean distance, or a dot product between query and sets of text information embeddings. For example, the embedding model 104 can receive a first query with a corresponding first set of text information, embed both the first query and the first set of text information, and calculate the metric 105 based on the embeddings of the first query and the first set of text information.

In various implementations, the quality score generator 102 and the embedding models 104 can receive sets of text information as an input. In this case, each set of text information corresponds to at least one query. The quality score generator 102 then determines a quality score based on the retriever models retrieving the query corresponding to the set of text information.

The system 100 can include one or more correlation analyzers 106. The correlation analyzer 106 can receive the quality score from the quality score generator 102, one or more metrics 105 from the embedding models 104, and perform a correlation analysis between the quality score and the metrics 105. In various implementations, the correlation analyzer 106 receives a plurality of quality scores, a plurality of metrics 105, and performs the correlation analysis. Each of the metrics 105 per embedding model 104 can correspond to a quality score based on the query. The correlation analysis can identify which of the metrics 105 of the embedding models 104 correlates the most with the quality scores provided by the quality score generator 102. The embedding model 104 with metrics 105 having the highest correlation with the quality scores can then be chosen by the correlation analyzer 106 as a filter model 107 for synthetically generated data.

The correlation analysis can be performed following a plurality of quality score and metric 105 outputs. In this case, the correlation analyzer 106 can determine the embedding model 104 with the highest correlation by determining a correlation coefficient between the metrics 105 and the quality scores per embedding model 104. The correlation coefficient can be determined by, for example, plotting the metrics 105 against the quality scores. For example, the metrics 105 can be plotted on an x-axis, and quality scores on a y-axis to determine the correlation coefficient. In various implementations, the correlation coefficient can be determined by a regression model. In various implementations, the correlation analysis is performed following the output of one quality score and metric 105. In this case, the correlation analyzer 106 calculates a difference between the quality score and the metrics 105 of each of the embedding models 104 to choose which embedding model 104 to be the filter model 107.

Following determination of the filter model 107, the correlation analyzer 106 can determine a threshold to set the filter model 107 to. The filter model 107 can use the threshold to filter synthetically generated data (e.g., discard or keep queries). For example, the filter model 107 can receive queries from the synthetically generated data, calculate the metric 105, and filter the synthetically generated data by comparing the metric 105 to the threshold. Responsive to determining that the metric 105 satisfies the threshold (e.g., is equal to or less than), the query is kept and included in a subset of the synthetically generated data. The subset can then be used as training data for machine learning models.

To determine the threshold, the correlation analyzer 106 can calculate a mean value of the metric 105 using the filter model 107 for each quality score level. The quality score level can be categories of a number of retriever models that retrieved the corresponding set of text information for each of the plurality of queries. For example, given 3 retriever models, the quality score levels can be 0, 1, 2, and 3. The metrics 105 can then be categorized by the corresponding quality score of each of the metrics 105. The mean value of the metric 105 for the filter model 107 can thus be determined by categorizing the metrics 105 generated by the filter model 107 by quality score level, and calculating the mean value of the metrics 105 per quality score level. Based on a chosen quality score level, the threshold can be calculated by dividing the mean value of the metrics 105 with the correlation coefficient of the filter model 107. This calculation can be illustrated, as an example, by:

$$\text{Filter Threshold} = \frac{\text{Mean value of metric for quality score of } \left[\frac{N}{2}\right]}{\text{Correlation value of chosen embedding model}}$$

where N is a number of retriever models. For example, if N=6, the filter threshold would be calculated by the mean value of the metrics 105 of the filter model 107 at quality score level 3 (e.g., 3 retriever models retrieved the set of text information).

In various implementations, the threshold can be calculated by selecting the threshold to be an i-th percentile of all the metric 105 values (e.g., at all quality score levels) calculated using the filter model 107 where i is a number 100 or less. The i-th percentile can be based on a distribution of the metric 105 values. For example, given i=75, the threshold would be based on the metric 105 value at the $75^{th}$ percentile of the distribution of all the metric 105 values. The threshold can be selected based on user input. For example, if the user wants harder queries (e.g., less retriever models can retrieve relevant documents), the user can set the threshold to be lower (e.g., i=50).

The system 100 can include one or more proxy metric generators 108. The proxy metric generator 108 can calculate a proxy metric 109 based on the filter model 107. The proxy metric 109 can be the cosine similarity, Euclidian distance, or dot product between embeddings of the sets of text information and the queries using the filter model 107. The proxy metric 109 can be the metric 105 calculated by the filter model 107. The proxy metric 109 can replace the quality score generator 102 following the correlation analysis of at least one query and set of text information provided to the quality score generator 102 and the embedding models 104. For example, if the manually annotated dataset includes 1000 data points, the quality score generator 102 and the embedding models 104 can be fed 100 data points and the correlation analyzer 106 selects the filter model 107 based on the metrics 105 and quality scores of the 100 data points. Then, the proxy metric generator 108 can calculate the proxy metric 109 for the remaining 900 data points using the filter model 107. The proxy metric 109 calculated by the filter model 107 for each of the remaining 900 can be used to determine a difficulty of the query (e.g., how many retriever models can retrieve the corresponding set of text information). For example, instead of inputting the queries through embedding models 104 and the quality score generator 102, the queries can be input directly to the proxy metric generator 108 which can determine the proxy metric 109 for each of the queries via the filter model 107.

In various implementations, the proxy metric 109 is compared to the threshold to determine the quality score level of the query. In various implementations, the proxy metric generator 108 calculates the proxy metric 109 prior to determination of the threshold. The threshold is then calculated based on the metrics 105, and the proxy metrics 109 calculated by the filter model 107.

In various implementations, the proxy metric generator 108 can update the threshold. For example, responsive to determining the filter model 107 and the threshold for 100 data points of 1000 data points in total, the proxy metric generator 108 can determine metrics for the remaining 900 data points, and update the threshold with the calculated metrics. The threshold may also change based on a total of the calculated metrics increasing. For example, if the threshold was determined to be the $80^{th}$ percentile of all the calculated metrics, the $80^{th}$ percentile may change when the total of the calculated metrics increases from 100 to 1000.

In various implementations, the proxy metric 109 is the threshold calculated by the correlation analyzer 106. The queries can be input into the filter model 107 which then outputs the metric 105. The metric 105 can then be compared to the proxy metric 109 to determine the difficulty of the question.

The system 100 can include one or more data quality checkers 110. The data quality checker 110 can use the filter model 107 and the threshold to filter synthetically generated data. In other words, the data quality checker 110 can include or implement the filter model 107. The synthetically generated data can be generated by one or more data generators 112, such as the queries corresponding to the documents 111. In some examples, the data to be filtered or checked by the data quality checker 110 can include both the queries generated by the data generator 112 and the input of the data generator 112. In some examples, the data generator 112 can be an LLM, and receive documents 111 (e.g., sets of text information), as an input, and output queries (e.g., questions) based on the documents 111. The data generator 112 can associate or map (e.g., annotate) the documents 111 to the queries, and combine the documents and queries into a synthetically generated dataset.

The data quality checker 110 can receive the synthetically generated dataset from the data generator 112, and apply the filter model 107 to the synthetically generated dataset to obtain filtered synthetically generated data 113, which can be high-quality synthetically generated data. The filter model 107 can filter out data (e.g., some of the queries or the combination of queries and the mapped documents 111), following embedding the documents and queries within the synthetically generated dataset, based on the threshold. For example, for a given query and its mapped document 111, the filter model 107 can determine a metric (such as the metric 105), and the data quality checker 110 can compare the metric to the threshold, and retain the query (or the combination of query and the mapped document 111) if the metric for the query is equal to or lower than the threshold, and discard queries if the metric 105 is higher than the threshold. Depending on the manner in which the threshold is set up or the type of threshold, the data quality checker 110 can compare the metric to the threshold, and retain the query (or the combination of query and the mapped document 111) if the metric for the query is equal to or higher than the threshold, and discard queries if the metric 105 is lower than the threshold. The filter model 107 can then output the filtered synthetically generated data 113 (e.g., a subset of the synthetically generated dataset).

Figure 2:
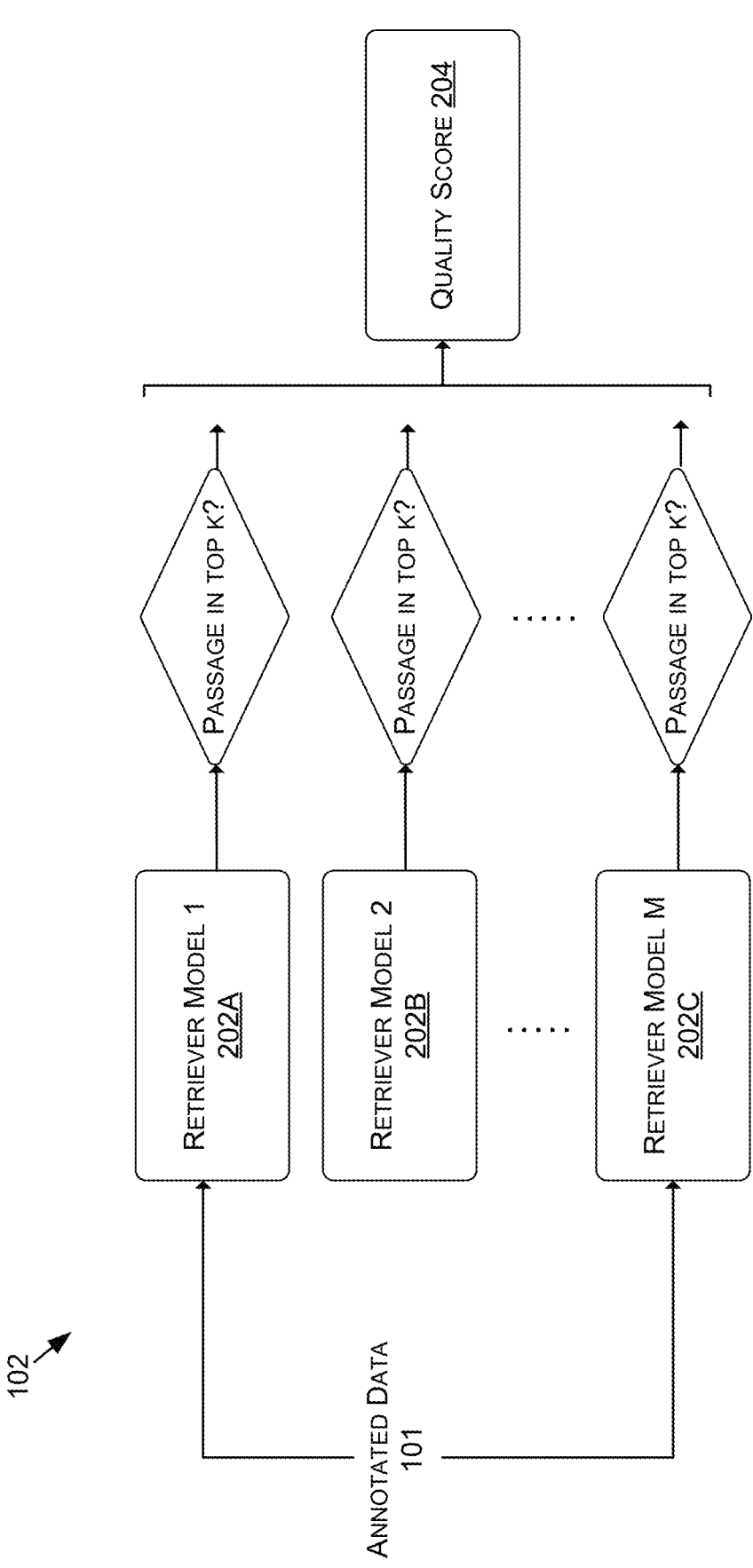
FIG. 2 is a block diagram of an example system to compute the quality score that can be used by the system of FIG. 1, in accordance with some implementations of the present disclosure.

FIG. 2 is a block diagram of an example quality score generator 102 to compute the quality score that can be used by the system of FIG. 1, in accordance with some implementations of the present disclosure. It should be understood that this and other arrangements described herein are set forth only as examples. Other arrangements and elements (e.g., machines, interfaces, functions, orders, groupings of functions, etc.) may be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by entities may be carried out by hardware, firmware, and/or software. For instance, various functions may be carried out by a processor executing instructions stored in memory.

The quality score generator 102 can include a first retriever model 202A, a second retriever model 202B, and m retriever models 202C (herein referred to as retriever models 202). M retriever models 202C can encompass any number of embedding models. The retriever model 202 can encode the query into a vector. The retriever model 202 can then retrieve top-k relevant sets of text information (e.g., document) of the query where k is a numerical value. The retriever model 202 can retrieve the top-k relevant sets of text information from at least one of, but not limited to, a corpus, a dataset, a database, an array, etc. K can be determined by user input and/or a difficulty and/or specificity of the query. For example, a query with 10 words may have a lower k than a query with 5 words. The retriever model 202 can determine, based on the query vector, the top-k relevant sets of text information based on the relevance of the sets of text information. The relevance can be determined by, but not limited to, cosine similarity, Euclidean distance, and dot product between the query and sets of text information embeddings.

The quality score generator 102 can input the annotated data 101 into the retriever models 202. Once the retriever models 202 output their respective top-k sets of text information, the quality score generator 102 can evaluate how many of the retriever models 202 retrieved the set of text information corresponding to the query. A quality score 204 (e.g., the quality score of FIG. 1) can be the number of retriever models 202 that retrieve the set of text information corresponding the query. For example, a query annotated with one set of text information is input into three of the retriever models 202. Two of the retriever models 202 retrieve the one set of text information in their top-k results, while one of the retriever models 202 does not. In this case, the quality score 204 is 2.

In various implementations, a same portion of the annotated data 101 can be inputted into both the retriever models 202 and the embedding models 104. For example, a first portion of the annotated data 101 is inputted into the retriever models 202 and the embedding models 104 simultaneously, and the retriever models 202 and the embedding models 104 calculate the quality score 204 and the metrics 105 in parallel, respectively. Thereafter, a second portion of the annotated data 101 is inputted into the retriever models 202 and the embedding models 104 simultaneously, and the retriever models 202 and the embedding models 104 calculate the quality score 204 and the metrics 105 in parallel, respectively. In various implementations, the quality score generator 102 and the embedding models 104 include synchronization objects to synchronize computation of the quality score 204 and the metrics 105. In this case, the quality scores 204 and the metrics 105 are output simultaneously, and the correlation analyzer 106 can then perform the correlation analysis.

In various implementations, the queries of the annotated data 101 correspond to more than one set of text information. In this case, the quality score 204 can be calculated based on how many of the retriever models 202 retrieve at least one of the sets of text information that the query corresponds to.

The system 100 can include a control system for an autonomous or semi-autonomous machine, a perception system for an autonomous or semi-autonomous machine, a system implemented using a robot, an aerial system, a medical system, a boating system, a smart area monitoring system, a system for performing deep learning operations, a system for performing simulation operations, a system for generating or presenting virtual reality (VR) content, augmented reality (AR) content, or mixed reality (MR) content, a system for performing digital twin operations, a system implemented using an edge device, a system incorporating one or more virtual machines (VMs), a system for generating synthetic data, a system implemented at least partially in a data center, a system for performing conversational artificial intelligence (AI) operations, a system for performing generative AI operations, a system implementing language models, a system implementing chatbots, a system implementing semantic searches, a system implementing information retrieval, a system implementing vision language models (VLMs), a system implementing large language models (LLMs), a system implementing multi-modal language models, a system for hosting one or more real-time streaming applications, a system for performing light transport simulation, a system for performing collaborative content creation for 3D assets, or a system implemented at least partially using cloud computing resources.

The system 100 can include a system implementing chatbots. Chatbots are designed to simulate conversation and can process and respond to user queries (e.g., questions) via natural language processing (NLP) and machine learning algorithms. Chatbots can be rule-based (e.g. predetermined rules and pattern recognition), AI-based (e.g., using machine learning), or a hybrid incorporating both rule-based and AI-based structures. The system 100 can include a system implementing semantic searches. Semantic searches are configured to recognize intent, context, and contextual information of user queries. To do this, semantic searches can implement word embeddings, contextual embeddings, NLP, and the like. Examples that use semantic search is a search engine. The system 100 can include a system implementing information retrieval. Information retrieval involves retrieving relevant information from a database in response to a user query. Information retrieval can be configured to receive the user query and identify which information in the database is relevant to the user query via a retrieval model. An overall information retrieval system can include collecting and preprocessing documents (e.g., information in the database), indexing the documents, processing the user query, retrieving documents via the retrieval model, ranking the retrieved documents based on relevance, providing the documents to the user, and then evaluating the retrieval process.

Figure 3:
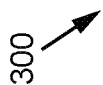
FIG. 3 is a table of example retriever models and corresponding quality scores, in accordance with some implementations of the present disclosure.

FIG. 3 is a table 300 of example retriever models and corresponding quality scores, in accordance with some implementations of the present disclosure. The table 300 shows 3 retriever models (e.g., retriever model 202) with quality scores (e.g., quality score 204) for each of the manually annotated queries (e.g., questions) of the data using k=5 (e.g., top 5 relevant sets of text information). Based off a number of retriever models that retrieved a corresponding set if text information for the manually annotated query, the queries were categorized per quality score. Table 300 also shows a distribution of the queries based on the quality score level which also illustrates a difficulty distribution (e.g., how many retriever models are able to retrieve the corresponding set of text information) of the queries. For example, the higher the quality score, the easier the question is.

Figure 4:
FIG. 4 is a table of an example of selecting an embedding model to be the filter model based on metrics of the embedding model having a highest correlation to quality scores, in accordance with some implementations of the present disclosure.

FIG. 4 is a table 400 of an example of selecting an embedding model to be the filter model based on metrics of the embedding model having a highest correlation to quality scores, in accordance with some implementations of the present disclosure. The table 400 shows 5 embedding models (e.g., embedding model 104), alongside calculated correlation coefficients (e.g., by the correlation analyzer 106). In this case, the correlation coefficients were calculated using the metrics (e.g., metrics 105) of the embedding models calculated via cosine similarity and the quality scores (e.g., easiness score). The embedding model chosen as the filter model (e.g., the filter model 107) is thus embedding model B as shown in table 400 since this embedding model had the highest correlation coefficient compared to the other 4 embedding models.

Figure 5:
FIG. 5 is a table of an example of calculated mean cosine similarities per quality score level of the filter model, in accordance with some implementations of the present disclosure.

FIG. 5 is a table 500 of an example of calculated mean cosine similarities per quality score level of the filter model, in accordance with some implementations of the present disclosure. To determine a threshold for the filter model, the mean cosine similarity is calculated for all the queries per quality score level (e.g., 0, 1, 2, 3). In various implementations, the Euclidean distance or the dot product can be calculated for all the queries per quality score level. Then, to calculate the threshold for the filter model, the mean cosine similarity of, for example, the quality score level 2 can be selected, and divided by the correlation coefficient of the filter model (e.g., embedding model B) of the table 400 to obtain a filter of 0.78. The filter of 0.78 indicates that synthetically generated queries will be retained in the dataset responsive to the filter model outputting a metric less than or equal to 0.78.

Figure 6:
FIG. 6 is a table of examples of using the filter model to filter synthetically generated data, in accordance with some implementations of the present disclosure.

FIG. 6 is a table 600 of examples of using the filter model to filter synthetically generated data, in accordance with some implementations of the present disclosure. The table 600 demonstrates the quality score distribution of annotated data 101, synthetically unfiltered data, and synthetically filtered data using the same retriever models and embedding models. By filtering the data, the quality score distribution of the synthetically filtered data becomes closer to the annotated quality score distribution versus the synthetically unfiltered data.

Now referring to FIG. 7, each block of method 700, described herein, comprises a computing process that may be performed using any combination of hardware, firmware, and/or software. For instance, various functions may be carried out by a processor executing instructions stored in memory. The method may also be embodied as computer-usable instructions stored on computer storage media. The method may be provided by a standalone application, a service or hosted service (standalone or in combination with another hosted service), or a plug-in to another product, to name a few. In addition, method 700 is described, by way of example, with respect to the system of FIG. 1. However, this method may additionally or alternatively be executed by any one system, or any combination of systems, including, but not limited to, those described herein.

FIG. 7 is a flow diagram of an example method 700 for selecting and applying a filter model, in accordance with some implementations of the present disclosure. At block 702, the quality score generator 102 (e.g., the retriever models 202) determines a quality score (e.g., the quality score 204) of each of a plurality of queries in a first dataset using a plurality of retriever models (e.g., the retriever models 202). The first dataset can be an annotated dataset (e.g., the annotated data 101, which can be manually annotated).

In various implementations, the first dataset includes the plurality of queries and a plurality of sets of text information, each of the plurality of queries annotated to be mapped to the set of text information. In this case, each of the plurality of queries maps (e.g., corresponds to) one of the plurality of sets of text information. The quality score can be determined based one at least a number of the plurality of retriever models that retrieved a set of text information corresponding to each of the plurality of queries. In various implementations, the set of text information includes, for each of the plurality of queries, at least one of at least one passage, at least one word, at least one phrase, at least one segment of texts, at least one string, at least one document, or at least one text file.

In various implementations, determining the quality score of each of the plurality of queries at block 702 includes applying each of the plurality of queries as an input into each of the plurality of retriever models and determining at least one set of output text information from each of the retriever models based at least in part on the input. Next, determining the number of the plurality of retriever models each of which has the at least one set of output text information that comprises the set of text information is performed at block 702. In this case, the quality score is determined based on how many retriever models included the set of text information in at least one set of output text information.

In various implementations, determining the quality score of each of the plurality of queries at block 702 includes applying each of the plurality of queries as an input into each of the plurality of retriever models and determining a plurality of sets of output text information from each of the retriever models based at least in part on the input. Next, determining the number of the plurality of retriever models each of which has the set of text information in a top k number of sets of the plurality of sets of output text information. For example, as seen in FIG. 2, to determine the quality score 204, the output of the retriever model 202 is evaluated to determine if the corresponding set of text information is within the top-k results of the retriever model 202. The quality score 204 is thus a total of the output of the retriever models 202 that retrieved the corresponding set of text information in their top-k results.

At block 704, a metric (e.g., the metric 105) indicative of a relationship between each of the plurality of queries and the set of text information of the first dataset is determined using a plurality of embedding models (e.g., the embedding models 104). The relationship can be based on the embeddings provided to the plurality of queries and the set of text information by the plurality of embedding models. The relationship can be a similarity between the embeddings. The metric can be calculated via cosine similarity, Euclidean distance, or by dot product between embeddings of each of the plurality of queries and embeddings of the set of text information.

At block 706, one of the plurality of embedding models can be selected as a filter model (e.g., the filter model 107) based at least in part on a correlation between the metrics outputted by the plurality of embedding models and the quality scores for the plurality of queries by the plurality of retriever models. Block 706 can be performed by, for example, the correlation analyzer 106. A correlation coefficient can be calculated between the metrics and the quality score, and the one of the plurality of embeddings models with a highest correlation coefficient can be selected as the filter model.

In various implementations, the metric of the filter model is set as a threshold (e.g., the proxy metric 109) in filtering the plurality of queries and the plurality of sets of text information in the second dataset. For example, based off calculations performed on the first dataset, the filter model outputs a metric, and the metric is used as the threshold to filter the plurality of queries and the plurality of sets of text information in the second dataset.

In various implementations, setting the threshold includes determining an average value of the metrics determined by the filter model for each of the plurality of quality scores determined for the plurality of queries. Setting the threshold can also include determining the threshold based at least in part on the average value and a correlation value determined for the filter model for the correlation between the metrics outputted by the filter model and the quality scores for the plurality of queries. For example, setting the threshold via determining the average value and correlation value can be performed by the correlation analyzer 106.

In various implementations, the threshold can be set to be an i-th percentile of the metrics outputted by the filter model where i is a numerical value 100 or less.

At block 708, the filter model can be applied to filter a plurality of queries and a plurality of sets of text information in a second dataset. The second dataset can be synthetically generated data generated by the data generator 112 (e.g., provided via an LLM). The filter model can be the selected one of the embedding models 202, and also have a threshold to filter the plurality of queries and sets of text information.

In various implementations, the filter model can filter the plurality of queries and the plurality of sets of text information in the second dataset to adjust difficulty of the plurality of queries and the plurality of sets of text information based on a threshold. For example, applying the filter model at block 708 can include the filter model using the threshold to retain or discard the plurality of queries based on the metrics generated by the filter model. By using the threshold, the filter model can identify a subset of the second dataset. Varying the threshold can change the difficulty of the subset of the second dataset. For example, setting the threshold to be $50^{th}$ percentile can increase the difficulty while $75^{th}$ percentile can decrease the difficulty of the plurality of queries for a retriever model to retrieve the corresponding set of text information.

Now referring to FIG. 8, each block of method 800, described herein, comprises a computing process that may be performed using any combination of hardware, firmware, and/or software. For instance, various functions may be carried out by a processor executing instructions stored in memory. The method may also be embodied as computer-usable instructions stored on computer storage media. The method may be provided by a standalone application, a service or hosted service (standalone or in combination with another hosted service), or a plug-in to another product, to name a few. In addition, method 800 is described, by way of example, with respect to the system of FIG. 1. However, this method may additionally or alternatively be executed by any one system, or any combination of systems, including, but not limited to, those described herein.

FIG. 8 is a flow diagram of an example method 800 of selecting a filter model (e.g., the filter model 107), and filtering using the filter model and a threshold, in accordance with some implementations of the present disclosure. At block 802, the method 800 includes determining, using a plurality of retriever models (e.g., the retriever models 202), a quality score (e.g., the quality score 204) of each of a plurality of queries in the first dataset, wherein the quality score is determined based at least part on a number of the plurality of retriever models having retrieved a set of text information corresponding to each of the plurality of queries. The quality score can thus be a total number of the plurality of retriever models that correctly retrieved the set of text information in response to an input of each of the plurality of queries.

At block 804, the method 800 includes determining, using a plurality of embedding models (e.g., the embedding models 104), a metric (e.g., the metric 105) indicative of a relationship between each of the plurality of queries and the set of text information. The metric can be based on a similarity between the embeddings of the plurality of queries and the embeddings of the set of text information.

At block 806, one of the plurality of embedding models is selected as the filter model (e.g., the filter model 107) based at least in part on correlation between the metrics outputted by the plurality of embedding models and the quality scores for the plurality of queries. Block 806 can be performed by, for example, the correlation analyzer 106. The correlation can be determined via a correlation coefficient between the metrics and the quality scores.

At block 808, a plurality of queries and a plurality of sets of text information in a second dataset can be received. The second dataset can include data synthetically generated using a language model (e.g., LLM). The second dataset can be generated by, for example, the data generator 112.

At block 810, the plurality of queries and the plurality of sets of text information in the second dataset can be filtered using the filter model and a threshold. Block 810 can be performed by, for example, the data checker quality 110. The filtering can be configured to identify a subset of the second dataset which can be used as training data.

In various implementations, the metric determined at block 804 can be the threshold (e.g., the proxy metric 109) for filtering the plurality of queries and the plurality of sets of text information in the second dataset. In various implementations, setting the threshold includes determining an average value of the metrics determined by the filter model for each of the plurality of quality scores determined for the plurality of queries. Setting the threshold can also include determining the threshold based at least in part on the average value and a correlation value determined for the filter model for the correlation between the metrics outputted by the filter model and the quality scores for the plurality of queries. For example, setting the threshold via determining the average value and correlation value can be performed by the correlation analyzer 106. In various implementations, the threshold can be set to be an i-th percentile of the metrics outputted by the filter model where i is a numerical value 100 or less. In various implementations, the filter model can filter the plurality of queries and the plurality of sets of text information in the second dataset to adjust difficulty of the plurality of queries and the plurality of sets of text information based on a threshold.

Now referring to FIG. 9, each block of method 900, described herein, comprises a computing process that may be performed using any combination of hardware, firmware, and/or software. For instance, various functions may be carried out by a processor executing instructions stored in memory. The method may also be embodied as computer-usable instructions stored on computer storage media. The method may be provided by a standalone application, a service or hosted service (standalone or in combination with another hosted service), or a plug-in to another product, to name a few. In addition, method 900 is described, by way of example, with respect to the system of FIG. 1. However, this method may additionally or alternatively be executed by any one system, or any combination of systems, including, but not limited to, those described herein.

FIG. 9 is a flow diagram of another example method 900 of selecting a filter model, and filtering using the filter model and a threshold, in accordance with some implementations of the present disclosure. The method 900, at block 902, includes determining a filter model (e.g., the filter model 107) based on a correlation between quality scores (e.g., the quality score 204) determined by a plurality of retriever models (e.g., the retriever models 202) and metrics (e.g., the metrics 105) determined by a plurality of embedding models (e.g., the embedding models 104). The metrics can be indicative of relationships between the plurality of queries and the set of text information of a first dataset, wherein the filter model is selected from the plurality of embedding models. The first dataset can be a manually annotated dataset. The relationship can be a similarity relationship.

At block 904, a plurality of queries and a plurality of sets of text information in a synthetically generated dataset can be received. The synthetically generated dataset can be generated by, for example, the data generator 112.

At block 906, the plurality of queries and the plurality of sets of text information can be filtered using the filter model and a threshold. The filter model can output a subset of the synthetically generated data with an adjustable difficulty. The subset can be used as training data.

Example Computing Device

Figure 10:
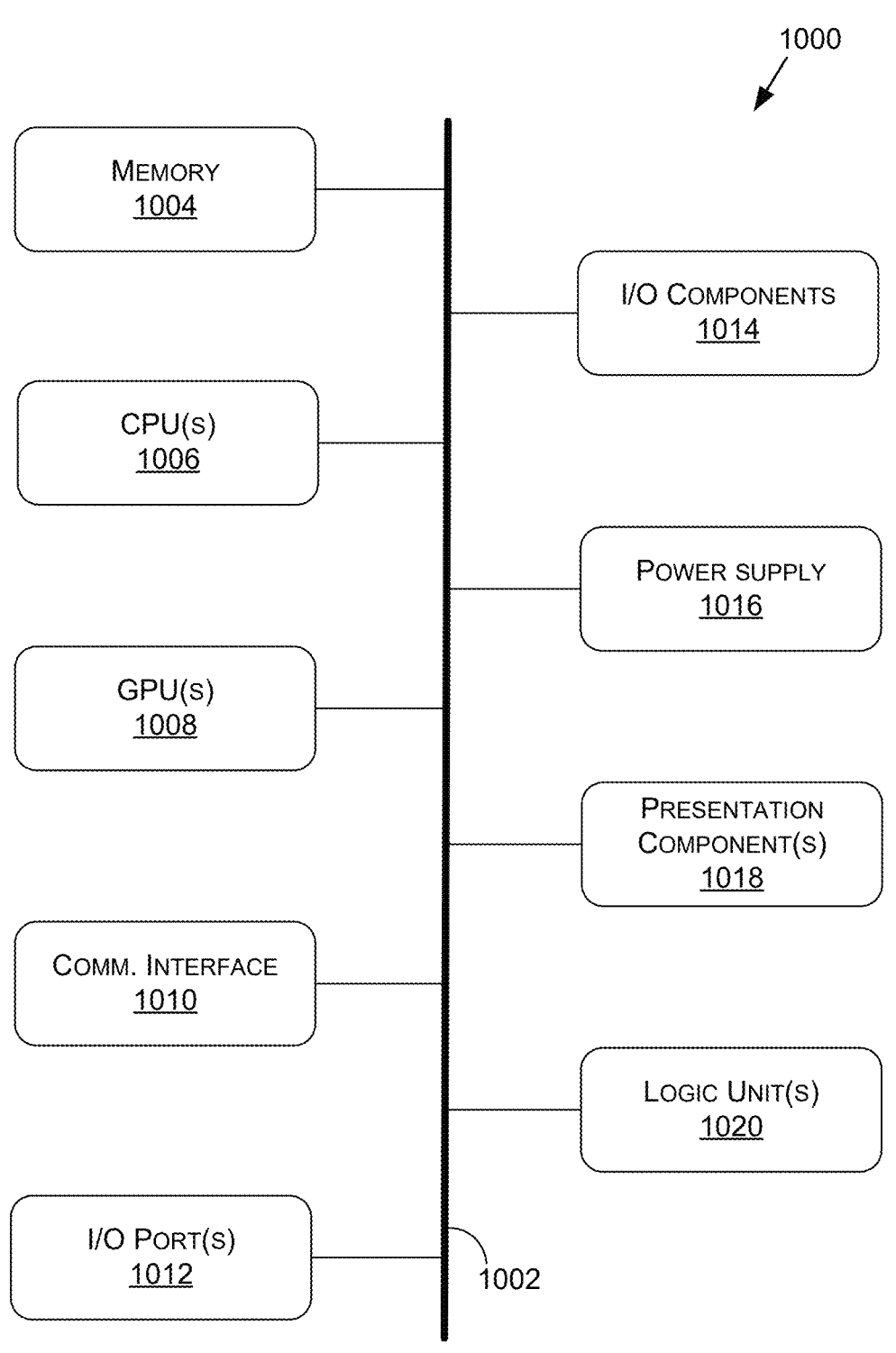
FIG. 10 is a block diagram of an example computing device suitable for use in implementing some implementations of the present disclosure.

FIG. 10 is a block diagram of an example computing device(s) 1000 suitable for use in implementing some implementations of the present disclosure. Computing device 1000 may include an interconnect system 1002 that directly or indirectly couples the following devices: memory 1004, one or more central processing units (CPUs) 1006, one or more graphics processing units (GPUs) 1008, a communication interface 1010, input/output (I/O) ports 1012, input/output components 1014, a power supply 1016, one or more presentation components 1018 (e.g., display(s)), and one or more logic units 1020. In at least one implementation, the computing device(s) 1000 may comprise one or more virtual machines (VMs), and/or any of the components thereof may comprise virtual components (e.g., virtual hardware components). For non-limiting examples, one or more of the GPUs 1008 may comprise one or more vGPUs, one or more of the CPUs 1006 may comprise one or more vCPUs, and/or one or more of the logic units 1020 may comprise one or more virtual logic units. As such, a computing device(s) 1000 may include discrete components (e.g., a full GPU dedicated to the computing device 1000), virtual components (e.g., a portion of a GPU dedicated to the computing device 1000), or a combination thereof.

Although the various blocks of FIG. 10 are shown as connected via the interconnect system 1002 with lines, this is not intended to be limiting and is for clarity only. For example, in some implementations, a presentation component 1018, such as a display device, may be considered an I/O component 1014 (e.g., if the display is a touch screen). As another example, the CPUs 1006 and/or GPUs 1008 may include memory (e.g., the memory 1004 may be representative of a storage device in addition to the memory of the GPUs 1008, the CPUs 1006, and/or other components). In other words, the computing device of FIG. 10 is merely illustrative. Distinction is not made between such categories as "workstation," "server," "laptop," "desktop," "tablet," "client device," "mobile device," "hand-held device," "game console," "electronic control unit (ECU)," "virtual reality system," and/or other device or system types, as all are contemplated within the scope of the computing device of FIG. 10.

The interconnect system 1002 may represent one or more links or busses, such as an address bus, a data bus, a control bus, or a combination thereof. The interconnect system 1002 may include one or more bus or link types, such as an industry standard architecture (ISA) bus, an extended industry standard architecture (EISA) bus, a video electronics standards association (VESA) bus, a peripheral component interconnect (PCI) bus, a peripheral component interconnect express (PCIe) bus, and/or another type of bus or link. In some implementations, there are direct connections between components. As an example, the CPU 1006 may be directly connected to the memory 1004. Further, the CPU 1006 may be directly connected to the GPU 1008. Where there is direct, or point-to-point connection between components, the interconnect system 1002 may include a PCIe link to carry out the connection. In these examples, a PCI bus need not be included in the computing device 1000.

The memory 1004 may include any of a variety of computer-readable media. The computer-readable media may be any available media that may be accessed by the computing device 1000. The computer-readable media may include both volatile and nonvolatile media, and removable and non-removable media. By way of example, and not limitation, the computer-readable media may comprise computer-storage media and communication media. The memory 1004 may include, for example, the manually annotated data.

The computer-storage media may include both volatile and nonvolatile media and/or removable and non-removable media implemented in any method or technology for storage of information such as computer-readable instructions, data structures, program modules, and/or other data types. For example, the memory 1004 may store computer-readable instructions (e.g., that represent a program(s) and/or a program element(s), such as an operating system. Computer-storage media may include, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may be accessed by computing device 1000. As used herein, computer storage media does not comprise signals per se.

The computer storage media may embody computer-readable instructions, data structures, program modules, and/or other data types in a modulated data signal such as a carrier wave or other transport mechanism and includes any information delivery media. The term "modulated data signal" may refer to a signal that has one or more of its characteristics set or changed in such a manner as to encode information in the signal. By way of example, and not limitation, the computer storage media may include wired media such as a wired network or direct-wired connection, and wireless media such as acoustic, RF, infrared and other wireless media. Combinations of any of the above should also be included within the scope of computer-readable media.

The CPU(s) 1006 may be configured to execute at least some of the computer-readable instructions to control one or more components of the computing device 1000 to perform one or more of the methods and/or processes described herein. The CPU(s) 1006 may each include one or more cores (e.g., one, two, four, eight, twenty-eight, seventy-two, etc.) that are capable of handling a multitude of software threads simultaneously. The CPU(s) 1006 may include any type of processor, and may include different types of processors depending on the type of computing device 1000 implemented (e.g., processors with fewer cores for mobile devices and processors with more cores for servers). For example, depending on the type of computing device 1000, the processor may be an Advanced RISC Machines (ARM) processor implemented using Reduced Instruction Set Computing (RISC) or an x86 processor implemented using Complex Instruction Set Computing (CISC). The computing device 1000 may include one or more CPUs 1006 in addition to one or more microprocessors or supplementary co-processors, such as math co-processors.

In addition to or alternatively from the CPU(s) 1006, the GPU(s) 1008 may be configured to execute at least some of the computer-readable instructions to control one or more components of the computing device 1000 to perform one or more of the methods and/or processes described herein. One or more of the GPU(s) 1008 may be an integrated GPU (e.g., with one or more of the CPU(s) 1006 and/or one or more of the GPU(s) 1008 may be a discrete GPU. In implementations, one or more of the GPU(s) 1008 may be a coprocessor of one or more of the CPU(s) 1006. The GPU(s) 1008 may be used by the computing device 1000 to render graphics (e.g., 3D graphics) or perform general purpose computations. For example, the GPU(s) 1008 may be used for General-Purpose computing on GPUs (GPGPU). The GPU(s) 1008 may include hundreds or thousands of cores that are capable of handling hundreds or thousands of software threads simultaneously. The GPU(s) 1008 may generate pixel data for output images in response to rendering commands (e.g., rendering commands from the CPU(s) 1006 received via a host interface). The GPU(s) 1008 may include graphics memory, such as display memory, for storing pixel data or any other suitable data, such as GPGPU data. The display memory may be included as part of the memory 1004. The GPU(s) 1008 may include two or more GPUs operating in parallel (e.g., via a link). The link may directly connect the GPUs (e.g., using NVLINK) or may connect the GPUs through a switch (e.g., using NVSwitch). When combined together, each GPU 1008 may generate pixel data or GPGPU data for different portions of an output or for different outputs (e.g., a first GPU for a first image and a second GPU for a second image). Each GPU may include its own memory, or may share memory with other GPUs.

In addition to or alternatively from the CPU(s) 1006 and/or the GPU(s) 1008, the logic unit(s) 1020 may be configured to execute at least some of the computer-readable instructions to control one or more components of the computing device 1000 to perform one or more of the methods and/or processes described herein. In implementations, the CPU(s) 1006, the GPU(s) 1008, and/or the logic unit(s) 1020 may discretely or jointly perform any combination of the methods, processes and/or portions thereof. One or more of the logic units 1020 may be part of and/or integrated in one or more of the CPU(s) 1006 and/or the GPU(s) 1008 and/or one or more of the logic units 1020 may be discrete components or otherwise external to the CPU(s) 1006 and/or the GPU(s) 1008. In implementations, one or more of the logic units 1020 may be a coprocessor of one or more of the CPU(s) 1006 and/or one or more of the GPU(s) 1008.

Examples of the logic unit(s) 1020 include one or more processing cores and/or components thereof, such as Data Processing Units (DPUs), Tensor Cores (TCs), Tensor Processing Units (TPUs), Pixel Visual Cores (PVCs), Vision Processing Units (VPUs), Graphics Processing Clusters (GPCs), Texture Processing Clusters (TPCs), Streaming Multiprocessors (SMs), Tree Traversal Units (TTUs), Artificial Intelligence Accelerators (AIAs), Deep Learning Accelerators (DLAs), Arithmetic-Logic Units (ALUs), Application-Specific Integrated Circuits (ASICs), Floating Point Units (FPUs), input/output (I/O) elements, peripheral component interconnect (PCI) or peripheral component interconnect express (PCIe) elements, and/or the like.

The communication interface 1010 may include one or more receivers, transmitters, and/or transceivers that enable the computing device 1000 to communicate with other computing devices via an electronic communication network, included wired and/or wireless communications. The communication interface 1010 may include components and functionality to enable communication over any of a number of different networks, such as wireless networks (e.g., Wi-Fi, Z-Wave, Bluetooth, Bluetooth LE, ZigBee, etc.), wired networks (e.g., communicating over Ethernet or InfiniBand), low-power wide-area networks (e.g., LoRaWAN, SigFox, etc.), and/or the Internet. In one or more implementations, logic unit(s) 1020 and/or communication interface 1010 may include one or more data processing units (DPUs) to transmit data received over a network and/or through interconnect system 1002 directly to (e.g., a memory of) one or more GPU(s) 1008.

The I/O ports 1012 may enable the computing device 1000 to be logically coupled to other devices including the I/O components 1014, the presentation component(s) 1018, and/or other components, some of which may be built in to (e.g., integrated in) the computing device 1000. Illustrative I/O components 1014 include a microphone, mouse, keyboard, joystick, game pad, game controller, satellite dish, scanner, printer, wireless device, etc. The I/O components 1014 can allow the user to input the threshold for filtering the synthetically generated data. The I/O components 1014 may provide a natural user interface (NUI) that processes air gestures, voice, or other physiological inputs generated by a user. In some instances, inputs may be transmitted to an appropriate network element for further processing. An NUI may implement any combination of speech recognition, stylus recognition, facial recognition, biometric recognition, gesture recognition both on screen and adjacent to the screen, air gestures, head and eye tracking, and touch recognition (as described in more detail below) associated with a display of the computing device 1000. The computing device 1000 may be include depth cameras, such as stereoscopic camera systems, infrared camera systems, RGB camera systems, touchscreen technology, and combinations of these, for gesture detection and recognition. Additionally, the computing device 1000 may include accelerometers or gyroscopes (e.g., as part of an inertia measurement unit (IMU)) that enable detection of motion. In some examples, the output of the accelerometers or gyroscopes may be used by the computing device 1000 to render immersive augmented reality or virtual reality.

The power supply 1016 may include a hard-wired power supply, a battery power supply, or a combination thereof. The power supply 1016 may provide power to the computing device 1000 to enable the components of the computing device 1000 to operate.

The presentation component(s) 1018 may include a display (e.g., a monitor, a touch screen, a television screen, a heads-up-display (HUD), other display types, or a combination thereof), speakers, and/or other presentation components. The presentation component(s) 1018 may receive data from other components (e.g., the GPU(s) 1008, the CPU(s) 1006, DPUs, etc.), and output the data (e.g., as an image, video, sound, etc.).

Example Data Center

Figure 11:
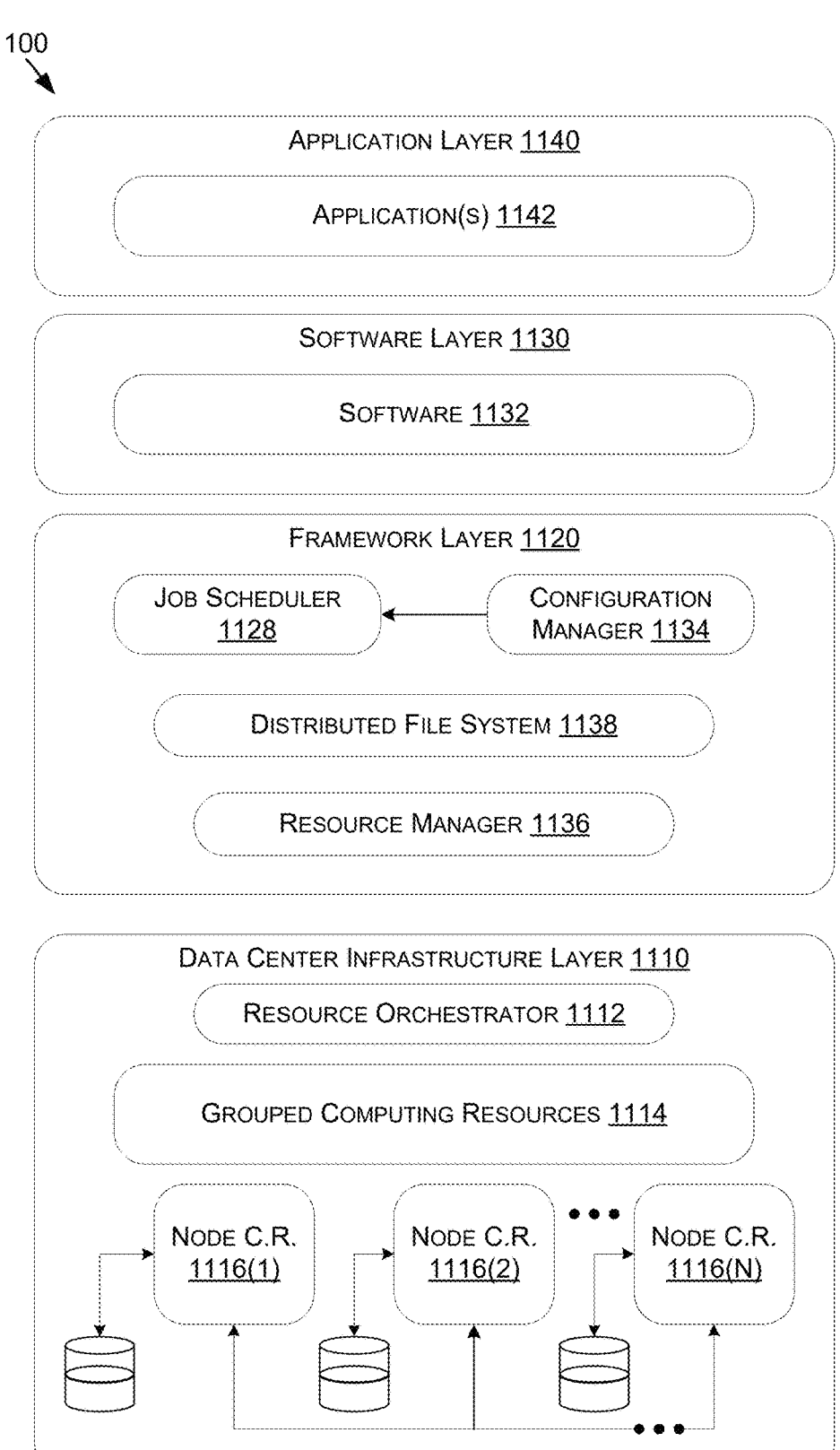
FIG. 11 is a block diagram of an example data center suitable for use in implementing some implementations of the present disclosure.

FIG. 11 illustrates an example data center 1100 that may be used in at least one implementations of the present disclosure. The data center 1100 may include a data center infrastructure layer 1110, a framework layer 1120, a software layer 1130, and/or an application layer 1140.

As shown in FIG. 11, the data center infrastructure layer 1110 may include a resource orchestrator 1112, grouped computing resources 1114, and node computing resources ("node C.R.s") 1116(1)-1116(N), where "N" represents any whole, positive integer. In at least one implementation, node C.R.s 1116(1)-1116(N) may include, but are not limited to, any number of central processing units (CPUs) or other processors (including DPUs, accelerators, field programmable gate arrays (FPGAs), graphics processors or graphics processing units (GPUs), etc.), memory devices (e.g., dynamic read-only memory), storage devices (e.g., solid state or disk drives), network input/output (NW I/O) devices, network switches, virtual machines (VMs), power modules, and/or cooling modules, etc. In some implementations, one or more node C.R.s from among node C.R.s 1116(1)-1116(N) may correspond to a server having one or more of the above-mentioned computing resources. In addition, in some implementations, the node C.R.s 1116(1)-11161(N) may include one or more virtual components, such as vGPUs, vCPUs, and/or the like, and/or one or more of the node C.R.s 1116(1)-1116(N) may correspond to a virtual machine (VM).

In at least one implementation, grouped computing resources 1114 may include separate groupings of node C.R.s 1116 housed within one or more racks (not shown), or many racks housed in data centers at various geographical locations (also not shown). Separate groupings of node C.R.s 1116 within grouped computing resources 1114 may include grouped compute, network, memory or storage resources that may be configured or allocated to support one or more workloads. In at least one implementation, several node C.R.s 1116 including CPUs, GPUs, DPUs, and/or other processors may be grouped within one or more racks to provide compute resources to support one or more workloads. The one or more racks may also include any number of power modules, cooling modules, and/or network switches, in any combination.

The resource orchestrator 1112 may configure or otherwise control one or more node C.R.s 1116(1)-1116(N) and/or grouped computing resources 1114. In at least one implementation, resource orchestrator 1112 may include a software design infrastructure (SDI) management entity for the data center 1100. The resource orchestrator 1112 may include hardware, software, or some combination thereof.

In at least one implementation, as shown in FIG. 11, framework layer 1120 may include a job scheduler 1128, a configuration manager 1134, a resource manager 1136, and/or a distributed file system 1138. The framework layer 1120 may include a framework to support software 1132 of software layer 1130 and/or one or more application(s) 1142 of application layer 1140. The software 1132 or application(s) 1142 may respectively include web-based service software or applications, such as those provided by Amazon Web Services, Google Cloud and Microsoft Azure. The framework layer 1120 may be, but is not limited to, a type of free and open-source software web application framework such as Apache Spark™ (hereinafter "Spark") that may utilize distributed file system 1138 for large-scale data processing (e.g., "big data"). In at least one implementation, job scheduler 1128 may include a Spark driver to facilitate scheduling of workloads supported by various layers of data center 1100. The configuration manager 1134 may be capable of configuring different layers such as software layer 1130 and framework layer 1120 including Spark and distributed file system 1138 for supporting large-scale data processing. The resource manager 1136 may be capable of managing clustered or grouped computing resources mapped to or allocated for support of distributed file system 1138 and job scheduler 1128. In at least one implementation, clustered or grouped computing resources may include grouped computing resource 1114 at data center infrastructure layer 1110. The resource manager 1136 may coordinate with resource orchestrator 1112 to manage these mapped or allocated computing resources.

In at least one implementation, software 1132 included in software layer 1130 may include software used by at least portions of node C.R.s 1116(1)-1116(N), grouped computing resources 1114, and/or distributed file system 1138 of framework layer 1120. One or more types of software may include, but are not limited to, Internet web page search software, e-mail virus scan software, database software, and streaming video content software.

In at least one implementation, application(s) 1142 included in application layer 1140 may include one or more types of applications used by at least portions of node C.R.s 1116(1)-1116(N), grouped computing resources 1114, and/or distributed file system 1138 of framework layer 1120. One or more types of applications may include, but are not limited to, any number of a genomics application, a cognitive compute, and a machine learning application, including training or inferencing software, machine learning framework software (e.g., PyTorch, TensorFlow, Caffe, etc.), and/or other machine learning applications used in conjunction with one or more implementations.

In at least one implementation, any of configuration manager 1134, resource manager 1136, and resource orchestrator 1112 may implement any number and type of self-modifying actions based on any amount and type of data acquired in any technically feasible fashion. Self-modifying actions may relieve a data center operator of data center 1100 from making possibly bad configuration decisions and possibly avoiding underutilized and/or poor performing portions of a data center.

The data center 1100 may include tools, services, software or other resources to train one or more machine learning models or predict or infer information using one or more machine learning models according to one or more implementations described herein. For example, a machine learning model(s) may be trained by calculating weight parameters according to a neural network architecture using software and/or computing resources described above with respect to the data center 1100. The data center 1100, may include and train the data generator 112 to generate synthetic data. In at least one implementation, trained or deployed machine learning models corresponding to one or more neural networks may be used to infer or predict information using resources described above with respect to the data center 1100 by using weight parameters calculated through one or more training techniques, such as but not limited to those described herein.

In at least one implementation, the data center 1100 may use CPUs, application-specific integrated circuits (ASICs), GPUs, FPGAs, and/or other hardware (or virtual compute resources corresponding thereto) to perform training and/or inferencing using above-described resources. Moreover, one or more software and/or hardware resources described above may be configured as a service to allow users to train or performing inferencing of information, such as image recognition, speech recognition, or other artificial intelligence services.

Example Network Environments

Network environments suitable for use in implementing implementations of the disclosure may include one or more client devices, servers, network attached storage (NAS), other backend devices, and/or other device types. The client devices, servers, and/or other device types (e.g., each device) may be implemented on one or more instances of the computing device(s) 1000 of FIG. 10—e.g., each device may include similar components, features, and/or functionality of the computing device(s) 1000. In addition, where backend devices (e.g., servers, NAS, etc.) are implemented, the backend devices may be included as part of a data center 1100, an example of which is described in more detail herein with respect to FIG. 11.

Components of a network environment may communicate with each other via a network(s), which may be wired, wireless, or both. The network may include multiple networks, or a network of networks. By way of example, the network may include one or more Wide Area Networks (WANs), one or more Local Area Networks (LANs), one or more public networks such as the Internet and/or a public switched telephone network (PSTN), and/or one or more private networks. Where the network includes a wireless telecommunications network, components such as a base station, a communications tower, or even access points (as well as other components) may provide wireless connectivity.

Compatible network environments may include one or more peer-to-peer network environments—in which case a server may not be included in a network environment—and one or more client-server network environments—in which case one or more servers may be included in a network environment. In peer-to-peer network environments, functionality described herein with respect to a server(s) may be implemented on any number of client devices.

In at least one implementation, a network environment may include one or more cloud-based network environments, a distributed computing environment, a combination thereof, etc. A cloud-based network environment may include a framework layer, a job scheduler, a resource manager, and a distributed file system implemented on one or more servers, which may include one or more core network servers and/or edge servers. A framework layer may include a framework to support software of a software layer and/or one or more application(s) of an application layer. The software or application(s) may respectively include web-based service software or applications. In implementations, one or more of the client devices may use the web-based service software or applications (e.g., by accessing the service software and/or applications via one or more application programming interfaces (APIs)). The framework layer may be, but is not limited to, a type of free and open-source software web application framework such as that may use a distributed file system for large-scale data processing (e.g., "big data").

A cloud-based network environment may provide cloud computing and/or cloud storage that carries out any combination of computing and/or data storage functions described herein (or one or more portions thereof). Any of these various functions may be distributed over multiple locations from central or core servers (e.g., of one or more data centers that may be distributed across a state, a region, a country, the globe, etc.). If a connection to a user (e.g., a client device) is relatively close to an edge server(s), a core server(s) may designate at least a portion of the functionality to the edge server(s). A cloud-based network environment may be private (e.g., limited to a single organization), may be public (e.g., available to many organizations), and/or a combination thereof (e.g., a hybrid cloud environment).

The client device(s) may include at least some of the components, features, and functionality of the example computing device(s) 1000 described herein with respect to FIG. 10. By way of example and not limitation, a client device may be embodied as a Personal Computer (PC), a laptop computer, a mobile device, a smartphone, a tablet computer, a smart watch, a wearable computer, a Personal Digital Assistant (PDA), an MP3 player, a virtual reality headset, a Global Positioning System (GPS) or device, a video player, a video camera, a surveillance device or system, a vehicle, a boat, a flying vessel, a virtual machine, a drone, a robot, a handheld communications device, a hospital device, a gaming device or system, an entertainment system, a vehicle computer system, an embedded system controller, a remote control, an appliance, a consumer electronic device, a workstation, an edge device, any combination of these delineated devices, or any other suitable device.

The disclosure may be described in the general context of computer code or machine-useable instructions, including computer-executable instructions such as program modules, being executed by a computer or other machine, such as a personal data assistant or other handheld device. Generally, program modules including routines, programs, objects, components, data structures, etc., refer to code that perform particular tasks or implement particular abstract data types. The disclosure may be practiced in a variety of system configurations, including hand-held devices, consumer electronics, general-purpose computers, more specialty computing devices, etc. The disclosure may also be practiced in distributed computing environments where tasks are performed by remote-processing devices that are linked through a communications network.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

What is claimed is:

1. A system, comprising one or more processors to:
   determine, using a plurality of retriever models, a quality score of each of a plurality of queries in a first dataset, wherein the quality score is determined based at least on a number of the plurality of retriever models having retrieved a set of text information corresponding to each of the plurality of queries;
   determine, using a plurality of embedding models, a metric indicative of a relationship between each of the plurality of queries and the set of text information of the first dataset; and
   select one of the plurality of embedding models as a filter model based at least on a correlation between the metrics outputted using the plurality of embedding models and the quality scores for the plurality of queries;
   apply the filter model to filter a plurality of queries and a plurality of sets of text information in a second dataset; and
   provide a filtered second dataset to update a machine learning model.

2. The system of claim 1, wherein the first dataset comprises the plurality of queries and a plurality of sets of text information, each of the plurality of queries annotated to be mapped to the set of text information.

3. The system of claim 1, wherein the set of text information comprises, for each of the plurality of queries, at least one of:
   at least one passage;
   at least one word;
   at least one phrase;
   at least one segment of text;
   at least one string;
   at least one document; or
   at least one text file.

4. The system of claim 1, wherein the determining the quality score of each of the plurality of queries comprises:
   applying each of the plurality of queries as an input into each of the plurality of retriever models and determining at least one set of output text information from each of the plurality of retriever models based at least in part on the input; and
   determining the number of the plurality of retriever models each of which has the at least one set of output text information that comprises the set of text information.

5. The system of claim 1, wherein the determining the quality score of each of the plurality of queries comprises:
   applying each of the plurality of queries as an input into each of the plurality of retriever models and determining a plurality of sets of output text information from each of the retriever models based at least on the input; and determining the number of the plurality of retriever models each of which has the set of text information in a top k number of sets of the plurality of sets of output text information.

6. The system of claim 1, wherein the metric comprises at least one of:

a cosine similarity between embeddings of each of the plurality of queries and embeddings of the set of text information;

a Euclidian distance between embeddings of each of the plurality of queries and embeddings of the set of text information; or a dot product between embeddings of each of the plurality of queries and embeddings of the set of text information.

7. The system of claim 1, wherein the one of the plurality of embedding models having the metrics with highest correlation to the quality scores is selected as the filter model.

8. The system of claim 1, wherein the one or more processors are further to set the metric determined for each of the plurality of queries and the set of text information as a threshold in filtering the plurality of queries and the plurality of sets of text information in the second dataset.

9. The system of claim 8, wherein the setting the threshold comprises:

determining an average value of the metrics determined using the filter model for each of the plurality of quality scores determined for the plurality of queries; and determining the threshold based at least on the average value and a correlation value determined for the filter model for the correlation between the metrics outputted using the filter model and the quality scores for the plurality of queries.

10. The system of claim 8, wherein the threshold is set to be an i-th percentile of the metrics outputted using the filter model.

11. The system of claim 1, wherein the filter model is to filter the plurality of queries and the plurality of sets of text information in the second dataset to adjust difficulty of the plurality of queries and the plurality of sets of text information based at least on a threshold.

12. The system of claim 1, wherein the second dataset comprises data synthetically generated using a language model, and the filtering is configured to identify a subset of the second dataset.

13. The system of claim 1, wherein the one or more processors are comprised in at least one of:

a control system for an autonomous or semi-autonomous machine;

a perception system for an autonomous or semi-autonomous machine;

a system implemented using a robot;

an aerial system;

a medical system;

a boating system;

a smart area monitoring system;

a system for performing deep learning operations;

a system for performing simulation operations;

a system for generating or presenting virtual reality (VR) content, augmented reality (AR) content, or mixed reality (MR) content;

a system for performing digital twin operations;

a system implemented using an edge device;

a system incorporating one or more virtual machines (VMs);

a system for generating synthetic data;

a system implemented at least partially in a data center;

a system for performing conversational artificial intelligence (AI) operations;

a system for performing generative AI operations;

a system implementing language models;

a system implementing chatbots;

a system implementing semantic searches;

a system implementing information retrieval;

a system implementing vision language models (VLMs);

a system implementing large language models (LLMs);

a system implementing multi-modal language models;

a system for hosting one or more real-time streaming applications;

a system for performing light transport simulation;

a system for performing collaborative content creation for 3D assets; or a system implemented at least partially using cloud computing resources.

14. A system applying a filter model determined using a first dataset, the system comprising one or more processors to:

receive a plurality of queries and a plurality of sets of text information in a second dataset;

filter, using the filter model and a threshold, the plurality of queries and the plurality of sets of text information in the second dataset, wherein the filter model is determined at least by:

determining, using a plurality of retriever models, a quality score of each of a plurality of queries in the first dataset, wherein the quality score is determined based at least on a number of the plurality of retriever models having retrieved a set of text information corresponding to each of the plurality of queries;

determining, using a plurality of embedding models, a metric indicative of a relationship between each of the plurality of queries and the set of text information; and selecting one of the plurality of embedding models as the filter model based at least on a correlation between the metrics outputted using the plurality of embedding models and the quality scores for the plurality of queries; and generate a filtered second dataset for updating a machine learning model.

15. The system of claim 14, wherein the second dataset comprises data synthetically generated using a language model, and the filtering is configured to identify a subset of the second dataset.

16. The system of claim 14, wherein the metric determined for each of the plurality of queries and the set of text information is set as the threshold in filtering the plurality of queries and the plurality of sets of text information in the second dataset.

17. The system of claim 16, wherein setting the threshold comprises:

determining an average value of the metrics determined using the filter model for each of the plurality of quality scores determined for the plurality of queries; and determining the threshold based at least on the average value and a correlation value determined for the filter model for the correlation between the metrics outputted using the filter model and the quality scores for the plurality of queries.

18. The system of claim 16, wherein the threshold is set to be an i-th percentile of the metrics outputted using the filter model.

19. The system of claim 1, wherein the plurality of queries and the plurality of sets of text information in the second dataset are filtered to adjust difficulty of the plurality of queries and the plurality of sets of text information based on a threshold.

20. A method, comprising:

receiving a plurality of queries and a plurality of sets of text information in a synthetically generated dataset;

filtering, using a filter model and a threshold, the plurality of queries and the plurality of sets of text information in the synthetically generated dataset, wherein the filter model is determined based at least part on a correlation between:

quality scores for a plurality of queries in a first dataset determined using a plurality of retriever models; and metrics, determined using a plurality of embedding models, that are indicative of relationships between the plurality of queries and the plurality of sets of text information of the first dataset, wherein the filter model is selected from the plurality of embedding models; and providing a filtered second dataset to update a machine learning model.

* * * * *